(12) United States Patent
Utagawa et al.

(10) Patent No.: US 8,416,336 B2
(45) Date of Patent: Apr. 9, 2013

(54) IMAGE SENSOR AND IMAGE-CAPTURING DEVICE

(75) Inventors: Ken Utagawa, Yokohama (JP); Yosuke Kusaka, Yokohama (JP)

(73) Assignee: Nikon Corporation, Tokyo (JP)

( * ) Notice: Subject to any disclaimer, the term of this patent is extended or adjusted under 35 U.S.C. 154(b) by 415 days.

(21) Appl. No.: 12/453,994

(22) Filed: May 28, 2009

(65) Prior Publication Data

US 2009/0295964 A1    Dec. 3, 2009

Related U.S. Application Data

(60) Provisional application No. 61/129,045, filed on Jun. 2, 2008.

(30) Foreign Application Priority Data

Jun. 2, 2008  (JP) ................................ 2008-144209

(51) Int. Cl.
*H04N 5/232*  (2006.01)
*H04N 5/335*  (2006.01)

(52) U.S. Cl. ........................................ 348/345; 348/302

(58) Field of Classification Search .................. 348/345, 348/302

See application file for complete search history.

(56) References Cited

U.S. PATENT DOCUMENTS 6,518,640 B2   2/2003  Suzuki et al.
6,829,008 B1   12/2004 Kondo et al.
2007/0102619 A1 * 5/2007 Kusaka ...................... 250/201.2
2008/0084483 A1   4/2008 Kusaka
2008/0152215 A1 * 6/2008 Horie et al. .................. 348/345

FOREIGN PATENT DOCUMENTS

JP   A-2000-156823   6/2000
JP   A-2008-085738   4/2008

OTHER PUBLICATIONS

Sep. 11, 2012 Office Action issued in JP Application No. 2008-144209 (with English translation).

* cited by examiner

*Primary Examiner* — Ricky Mack
*Assistant Examiner* — Zachary Wilkes
(74) *Attorney, Agent, or Firm* — Oliff & Berridge, PLC

(57) ABSTRACT

An image sensor includes: a plurality of imaging pixels; and a plurality of focus detection pixels constituted with a micro-lens and a photoelectric conversion element that receives a focus detection light flux transmitted through a photographic optical system and executes photoelectric conversion. The photoelectric conversion element in each of the focus detection pixels includes a light-receiving area where the focus detection light flux is received; light-receiving area images corresponding to each of the focus detection pixels are each formed as the light-receiving area is projected via the micro-lens onto a pupil plane of the photographic optical system; and a positional relationship of the micro-lens and the light-receiving area is determined in correspondence to an image height so that the light-receiving area images corresponding to all the focus detection pixels are superimposed on one another on the pupil plane.

11 Claims, 13 Drawing Sheets

ENLARGEMENT

IMAGE SENSOR AND IMAGE-CAPTURING DEVICE

INCORPORATION BY REFERENCE

This non-provisional application claims the benefit of U.S. Provisional Application No. 61/129,045 filed Jun. 2, 2008. This application also claims priority from Japanese Patent Application No. 2008-144209 filed Jun. 2, 2008. The disclosure of each of the earlier applications is incorporated herein by reference in its entirety.

BACKGROUND OF THE INVENTION

1. Field of the Invention

The present invention relates to an image sensor and an image-capturing device, used to capture a subject image.

2. Description of Related Art

Japanese Laid Open Patent Publication No. 2000-156823 discloses an image sensor that includes focus detection pixels disposed over part of a two-dimensional imaging pixel array, captures a subject image formed via a photographic optical system and detects the focusing condition of the photographic optical system through a split-pupil phase difference detection method.

SUMMARY OF THE INVENTION

There is still a challenge to be addressed in the image sensor in the related art described above in that a pair of focus detection light fluxes having passed through different areas of the exit pupil of the photographic optical system enter photoelectric conversion elements with less precision at focus detection pixels disposed at positions on the light-receiving surface of the image sensor further away from the point at which the optical axis of the photographic optical system intersects the image sensor, resulting in poorer focus detection accuracy.

According to the first aspect of the present invention, an image sensor comprises: a plurality of imaging pixels, each constituted with a first micro-lens and a first photoelectric conversion element that receives, via the first micro-lens, an image-capturing light flux transmitted through a photographic optical system and executes photoelectric conversion on the received image-capturing light flux; and a plurality of focus detection pixels disposed within a two-dimensional array of the plurality of imaging pixels, and made up with a plurality of first focus detection pixels each of which receives one light flux in a pair of focus detection light fluxes transmitted through the photographic optical system and a plurality of second focus detection pixels each of which receives the other light flux in the pair of focus detection light fluxes, the plurality of focus detection pixels each being constituted with a second micro-lens and a second photoelectric conversion element that receives, via the second micro-lens, a focus detection light flux transmitted through the photographic optical system and executes photoelectric conversion on the focus detection light flux. The second photoelectric conversion element in each of the plurality of first focus detection pixels includes a light-receiving area where the one focus detection light flux is received; the second photoelectric conversion element in each of the plurality of second focus detection pixels includes a light-receiving area where the other focus detection light flux is received; light-receiving area images corresponding to each of the plurality of focus detection pixels are each formed as the light-receiving area is projected via the second micro-lens onto a pupil plane of the photographic optical system; and a positional relationship of the second micro-lens and the light-receiving area is determined in correspondence to an image height so that the light-receiving area images corresponding to all the first focus detection pixels are superimposed on one another and that the light-receiving area images corresponding to all the second focus detection pixels are superimposed on one another on the pupil plane.

According to the second aspect of the present invention, in the image sensor according to the first aspect, it is preferred that the plurality of first focus detection pixels each receive the one light flux and part of the other light flux and the plurality of second focus detection pixels each receive the other light flux and part of the one light flux.

According to the third aspect of the present invention, in the image sensor according to the first aspect, it is preferred that the light-receiving area and the pupil plane achieve a substantially conjugate relationship in relation to the second micro-lens.

According to the fourth aspect of the present invention, in the image sensor according to the first aspect, it is preferred that the second photoelectric conversion element includes a photoelectric conversion area; and the light-receiving area is defined by the photoelectric conversion area.

According to the fifth aspect of the present invention, in the image sensor according to the first aspect, it is preferred that the second photoelectric conversion element includes a photoelectric conversion area; the plurality of focus detection pixels each include a shielding mask covering part of the photoelectric conversion area; and the light-receiving area is defined by the shielding mask.

According to the sixth aspect of the present invention, in the image sensor according to the first aspect, it is preferred that the second micro-lens assumes a circular shape viewed from the front and the first micro-lens assumes a substantially rectangular shape viewed from the front.

According to the seventh aspect of the present invention, in the image sensor according to the first aspect, it is preferred that the second micro-lens assumes either a circular shape or a substantially circular shape in a sectional view.

According to the eighth aspect of the present invention, in the image sensor according to the first aspect, it is preferred that a positional relationship between the first micro-lens and a photoelectric conversion area in the first photoelectric conversion element is uniform regardless of the image height.

According to the ninth aspect of the present invention, an image-capturing device comprises: an image sensor according to the first aspect; an image generation unit that generates a subject image based upon outputs from the plurality of imaging pixels; a focus detection unit that detects a focusing condition for the photographic optical system based upon outputs from the plurality of focus detection pixels; and a focus adjustment unit that executes focus adjustment for the photographic optical system based upon detection results provided by the focus detection unit.

DESCRIPTION OF PREFERRED EMBODIMENTS

Figure 1:
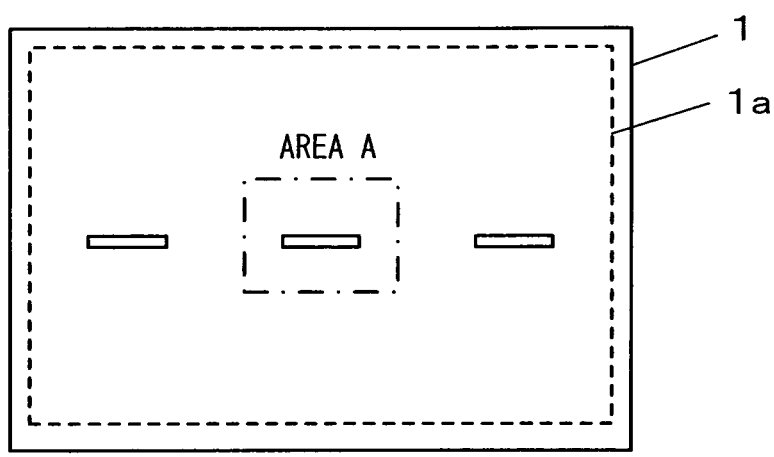
FIG. 1 is a front view of the image sensor achieved in an embodiment.
Figure 2A:
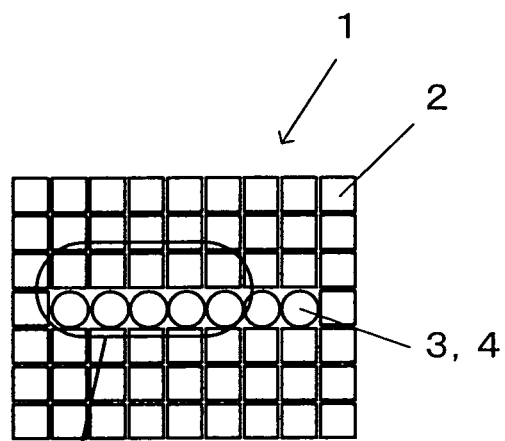
FIGS. 2A and 2B each present a front view of the image sensor in an enlargement.
Figure 2B:
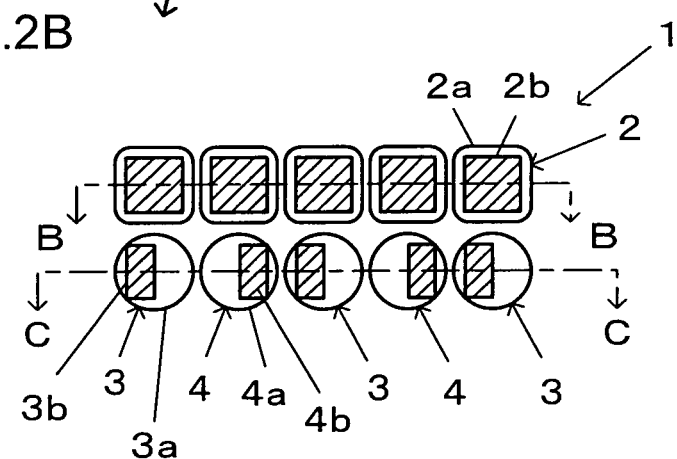
Figure 3A:
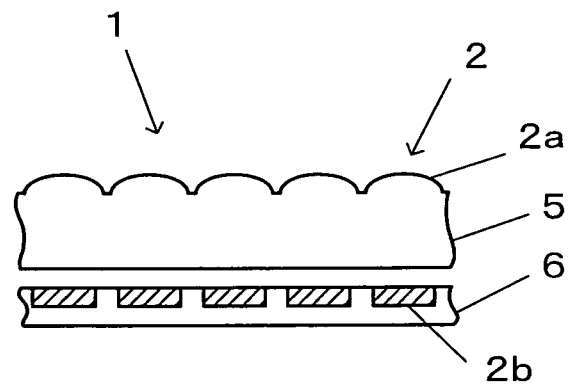
FIGS. 3A and 3B each present a sectional view of the image sensor in an enlargement.
Figure 3B:
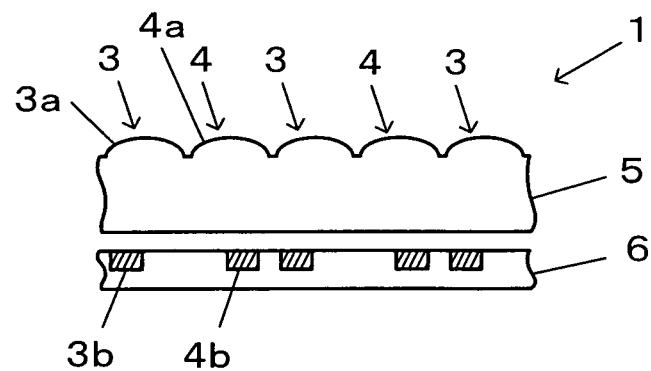

FIG. 1 is a front view of the image sensor achieved in an embodiment. The image sensor 1 in the embodiment includes imaging pixels disposed in a two-dimensional array within its effective pixel area 1a, with focus detection pixels disposed over part of the array, i.e., over a central area and areas to the left and to the right of the central area within the effective pixel area 1a. FIG. 2A shows the central area A in the image sensor 1 shown in FIG. 1 in an enlargement, whereas FIG. 2B shows part of FIG. 2A in a further enlargement. In addition, FIG. 3A shows the image sensor 1 in FIG. 2B in a section taken through B-B, whereas FIG. 3B shows the image sensor 1 in FIG. 2B in a section taken through C-C. It is to be noted that FIG. 2B shows photoelectric conversion elements disposed under micro-lenses as well.

As shown in FIGS. 3A and 3B, the image sensor 1 is formed by attaching a photoelectric conversion element array 6, with a plurality of photoelectric conversion elements (2b, 3b, 4b) two-dimensionally disposed therein, in close contact with the rear surface of a micro-lens array 5 constituted with a plurality of micro-lenses (2a, 3a, 4a) two-dimensionally disposed therein. A unit made up with a micro-lens and a photoelectric conversion element corresponding to the particular micro-lens is referred to as a pixel. A micro-lens 2a and the corresponding photoelectric conversion element 2b constitute an imaging pixel 2, a micro-lens 3a and the corresponding photoelectric conversion element 3b constitute a first focus detection pixel 3 and a micro-lens 4a and the corresponding photoelectric conversion element 4b constitute a second focus detection pixel 4. Namely, imaging pixels 2 are disposed in a two-dimensional array within the effective pixel area 1a with focus detection pixels 3 and 4 disposed over three areas, i.e., the central area, the left area and the right area, in the effective pixel area 1a, taking up part of the two-dimensional array at the image sensor 1.

The micro-lenses 2a of the imaging pixels 2 are formed so as to assume a rectangular shape when viewed from the front, as shown in FIGS. 2A and 2B, so as to maximize their performance as condensers by minimizing the areas separating adjacent micro-lenses. It is to be noted that they do not need to achieve a perfectly rectangular shape and that, depending upon certain manufacturing restrictions that may be imposed, they may assume a roughly rectangular shape instead. In addition, the shape of the micro-lenses 2a is designed so that they assume a sectional shape disallowing clear image formation, in order to ensure that a large amount of light is received thereat by minimizing the extent of decrease in the amount of peripheral light attributable to the positional relationship between the pupil of the photographic optical system and the aperture. As are the micro-lenses 2a, the photoelectric conversion elements 2b, indicated as the hatched areas in FIG. 2B, are formed in a rectangular shape viewed from the front, so as to maximize their condensing performance. Color filters (not shown) assuming red (R), green (G) and blue (B) colors are disposed between the micro-lenses 2a and the photoelectric conversion elements 2b at the imaging pixels 2, and the imaging pixels 2 equipped with the color filters are disposed in a Bayer array.

At the three areas, i.e., the central area, the left area and the right area, in the effective pixel area 1a of the image sensor 1, two types of focus detection pixels 3 and 4 are disposed alternately. The first focus detection pixels 3 each mainly receive a light flux having passed through the right-side area of the exit pupil of the photographic optical system, having a left-side area and a right-side area defined therein. The second focus detection pixels 4 each mainly receive a light flux having passed through the left-side area of the exit pupil of the photographic optical system. In order to assure the maximum level of imaging performance, the micro-lenses 3a and 4a at the focus detection pixels 3 and 4 are both formed in a circular shape viewed from the front. In addition, as shown in FIG. 3B, the micro-lenses 3a and 4a are designed to form circular or substantially circular curved surfaces in a sectional view, so as to maximize the imaging performance.

The photoelectric conversion elements 3b and 4b at the focus detection pixels 3 and 4 are formed to achieve shapes different from each other viewed from the front. The photoelectric conversion elements 3b at the focus detection pixels 3, indicated as the hatched areas in FIG. 2B, are each formed in a rectangular shape viewed from the front, taking up an area corresponding to the left half of the corresponding micro-lens 3a, so as to receive mainly a light flux having passed through the right-side area of the exit pupil of the photographic optical system via the micro-lens 3a. The photoelectric conversion elements 4b at the focus detection pixels 4 are each formed in a rectangular shape viewed from the front, taking up an area corresponding to the right half of the corresponding micro-lens 4a, so as to receive mainly a light flux having passed through the left-side area of the exit pupil of the photographic optical system via the micro-lens 4a.

It is to be noted that the micro-lens array 5, which includes two types of micro-lenses, i.e., the micro-lens 2a at the imaging pixels 2 and the micro-lenses 3a and 4a at the focus detection pixels 3 and 4, may be manufactured by optimizing the shapes of the circular masks used to form the two types of micro-lenses in conjunction with a micro-lens-forming film assuming a uniform film thickness.

Figure 4:
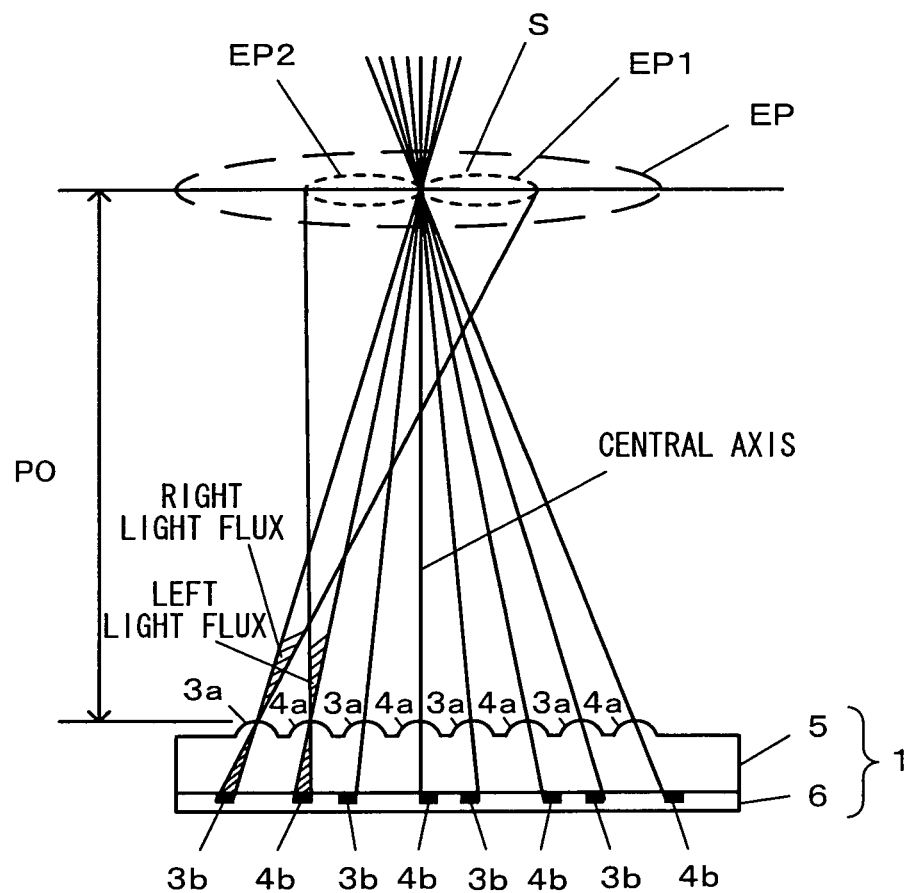
FIG. 4 illustrates the focus detection method adopted in the image sensor to detect the focusing condition via the focus detection pixels.

FIG. 4 illustrates the method adopted in the image sensor 1 to detect the focusing condition via the focus detection pixels 3 and 4. It is to be noted that FIG. 4 shows eight focus detection pixels 3 and 4 disposed at the center of the image sensor to facilitate the description of the focus detection method. EP in FIG. 4 indicates the exit pupil of the photographic optical system, whereas PO in FIG. 4 indicates the exit pupil distance measured from the micro-lens surfaces at the image sensor 1 to the exit pupil EP. In addition, the "central axis" in the figure is the vertical line passing through the center of the effective pixel area 1a (see FIG. 1) at the image sensor 1 and the embodiment is described by assuming that the central axis is in alignment with the optical axis of the photographic optical system.

As described earlier, at each first focus detection pixel 3, a "right light flux" having passed through a right-side area EP1 at the exit pupil EP having a pair of areas, i.e., the right-side area EP1 and a left-side area EP2 defined therein, is received at the photoelectric conversion element 3b via the micro-lens 3a, whereas at each second focus detection pixel 4, a "left light flux" having passed through the left-side area EP2 at the exit pupil EP, is received at the photoelectric conversion element 4b via the micro-lens 4a. Then, a relative shift quantity indicating the extent of shift manifested relative to each other by a first signal string a1, a2, a3, ... made up with the outputs from the photoelectric conversion elements 3b at the first focus detection pixels 3 set in sequence and a second signal string b1, b2, b3, ... made up with the outputs from the photoelectric conversion elements 4b at the second focus detection pixels 4 set in sequence, in the array of the focus detection pixels 3 and 4, is detected and based upon the relative shift amount, the focusing condition of the photographic optical system and a defocus amount representing the focusing condition may be detected through a split-pupil phase difference detection method of the known art.

It is to be noted that focus detection pixels 3 and 4 are disposed with similar arrangements over the left area and the right area in the effective pixel area 1a at the image sensor 1 and that focus detection may be executed via these focus detection pixels 3 and 4 through the split-pupil phase difference detection method.

Either of the following two methods may be adopted when setting the shape, the size and the positions of "photoelectric conversion areas", a term designated to refer to areas where the right light flux and the left light flux having passed through the pair of areas, i.e., the right-side area EP1 and the left-side area EP2 at the exit pupil EP of the photographic optical system, are received via the micro-lenses 3a and 4a and the received light actually undergoes photoelectric conversion.

Figure 5:
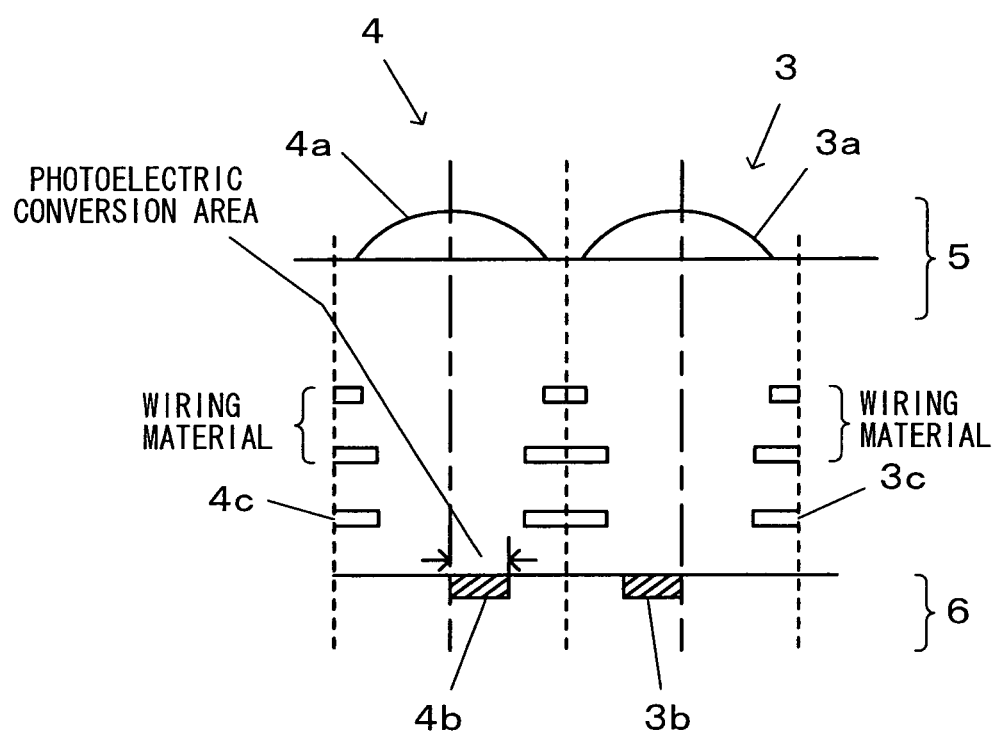
FIG. 5 shows photoelectric conversion areas defined by the ranges over which light actually received at the photoelectric conversion elements undergoes photoelectric conversion.

In the first method, photoelectric conversion elements 3b and 4b are formed on a semiconductor substrate upon which the photoelectric conversion element array 6 is formed, by ensuring that the ranges over which photoelectric conversion may be executed on the light actually received at the photoelectric conversion elements 3b and 4b on the semiconductor substrate upon which the photoelectric conversion element array 6 is formed, match the "photoelectric conversion areas", as shown in FIG. 5. FIG. 5 shows masks 3c and 4c and a wiring material disposed between the micro-lens array 5 and the photoelectric conversion element array 6. Through this method, the "photoelectric conversion areas" are defined in correspondence to the photoelectric conversion-enabled ranges at the light-receiving surfaces of the photoelectric conversion elements 3b and 4b and accordingly, the masks 3c and 4c have openings greater than the photoelectric conversion areas. It is to be noted that the photoelectric conversion areas are set at the light-receiving surfaces of the photoelectric conversion elements 3b and 4b in this case.

In the second method, the "photoelectric conversion areas" are defined in correspondence to the openings of the masks 3c and 4c disposed between the micro-lens array 5 and the photoelectric conversion element array 6. The photoelectric conversion areas are set on the plane upon which the masks 3c and 4c are disposed in this case.

As explained earlier, there is still a challenge to be addressed in the image sensor 1 in that a pair of focus detection light fluxes (the right light flux and the left light flux) having passed through the different areas EP1 and EP2 of the exit pupil EP of the photographic optical system enter the photoelectric conversion elements 3b and 4b with less precision at focus detection pixels 3 and 4 disposed at positions on the light-receiving surface of the image sensor further away from the point at which the optical axis of the photographic optical system intersects the light-receiving surface, resulting in poorer focus detection accuracy.

The challenge is addressed in the image sensor 1 achieved in the embodiment by (1) optimizing the positions of the "photoelectric conversion areas" relative to the exit pupil distance PO and (2) optimizing the imaging performance of the micro-lenses 3a and 4a at the focus detection pixels 3 and 4 relative to the exit pupil distance PO.

Figure 7:
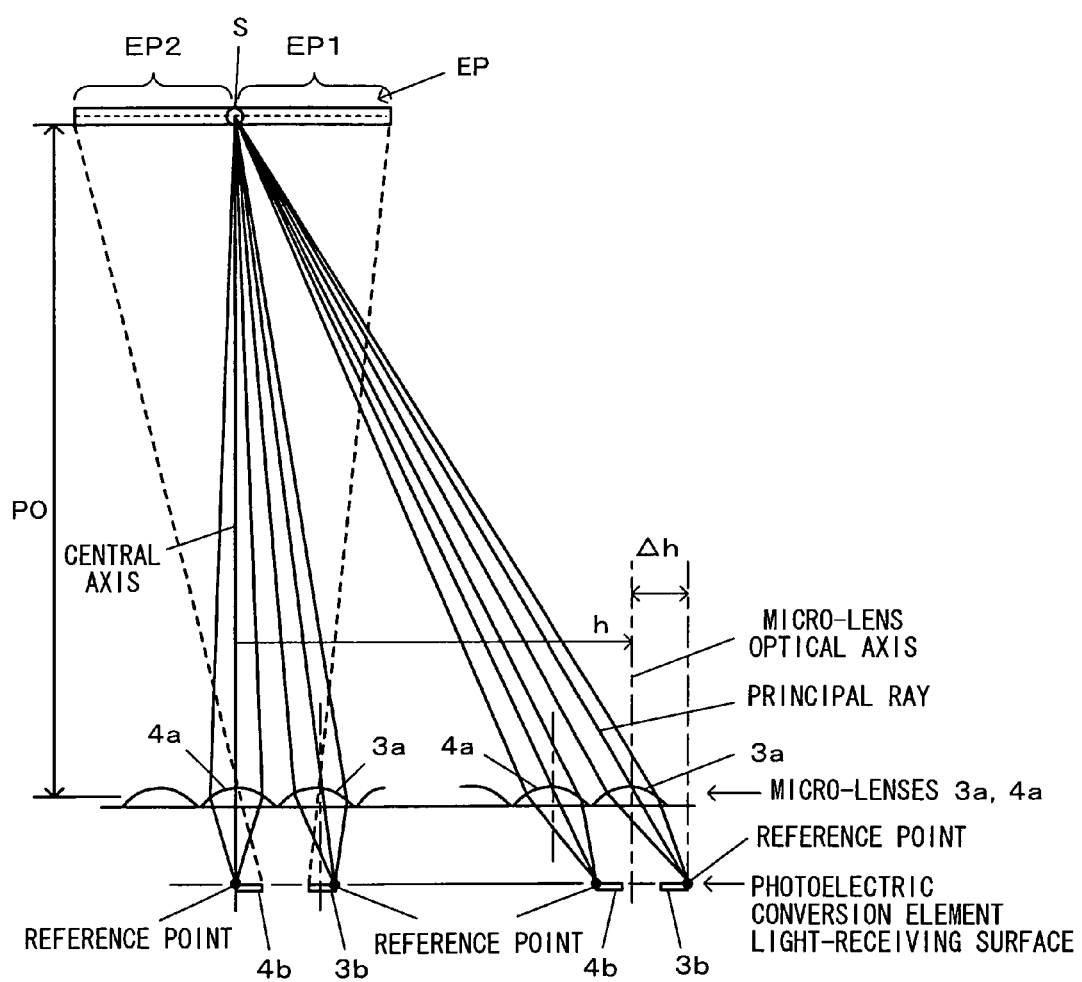
FIG. 7 is an optical path diagram showing a pair of light fluxes having passed through a pair of areas, i.e., a left area and a right area, in the exit pupil entering a pair of focus detection pixels disposed near the central axis (the vertical line passing through the point at which the optical axis of the photographic optical system intersects the image sensor) and focus detection pixels disposed near the point assuming an image height h measured from the central axis.

FIG. 7 is an optical path diagram showing a pair of light fluxes having passed through a pair of areas EP1 and EP2, i.e., a right-side area and a left-side area, in the exit pupil, entering a pair of focus detection pixels 3 and 4 disposed near the central axis (the vertical line passing through the point at which the optical axis of the photographic optical system intersects the image sensor 1) and focus detection pixels 3 and 4 disposed near the point assuming an image height h measured from the central axis. The following is a description given in reference to FIG. 7, of the optimization methods adopted to achieve (1) and (2) above in the embodiment. S in FIG. 7 indicates a point in the exit pupil EP present over the exit pupil distance PO from the micro-lens surfaces of the image sensor 1, at which the exit pupil intersects the central axis (the optical axis of the photographic optical system). In addition, the point at which the principal ray of light flux departing the point S at the exit pupil EP and entering a micro-lens assuming a position with the image height h intersects the light-receiving surface of the corresponding photoelectric conversion element is referred to as a "reference point".

It is to be noted that if the present invention is to be adopted in conjunction with a plurality of different types of photographic optical systems, a value representing the statistical average of the exit pupil distances corresponding to the plurality of photographic optical systems, determined through a specific method, should be designated as the exit pupil distance PO. In addition, while the embodiment is described by assuming that the optical axis of the photographic optical system is aligned with the central axis passing through the center of the image sensor 1, the central axis may be intentionally offset from the optical axis of the photographic optical system.

First, in reference to FIG. 7, the optimization method adopted to achieve (1) above is described. At the first focus detection pixel 3 assuming the position with the image height h measured from the point at which the central axis of the image sensor 1 (the optical axis of the photographic optical system) intersects the imaging plane, the position of the photoelectric conversion element 3b corresponding to the micro-lens 3a at the first focus detection pixel 3 is offset to the "reference point" from the optical axis of the micro-lens 3a. It is to be noted that the offset quantity Δh by which the photoelectric conversion element is offset is univocally determined optically in correspondence to the image height h, the exit pupil distance PO and the like. The first focus detection pixel 3 is disposed so as to allow the photoelectric conversion element 3 to range toward the central axis by aligning the right end of the photoelectric conversion element 3b with the reference point, so as to allow the right light flux having passed through the right-side area EP1 of the exit pupil EP to be received at the photoelectric conversion element 3b via the micro-lens 3a.

Likewise, the position of the photoelectric conversion element 4b corresponding to the micro-lens 4a of the second focus detection pixel 4 is offset to the reference point from the optical axis of the micro-lens 4a. The second focus detection pixel 4 is disposed so that the photoelectric conversion element 4b ranges further away from the central axis by aligning the left end of the photoelectric conversion element 4b with the reference point in order to allow the left light flux having passed through the left-side area EP2 of the exit pupil EP to be received at the photoelectric conversion element 4b via the micro-lens 4a. The second focus detection pixel 4 disposed on the central axis of the image sensor 1 assumes an image height h of 0 with the reference point thereof set on the central axis, and thus, the offset quantity by which the photoelectric conversion element 4b must be offset relative to the optical axis of the micro-lens 4a is 0.

As described above, at the focus detection pixels 3 and 4 assuming the position with the image height h measured from the central axis of the image sensor 1, the photoelectric conversion elements 3b and 4b are offset to the respective "reference points" from the optical axes of the micro-lenses 3a and 4a. As a result, the images of the "photoelectric conversion areas" corresponding to all the first focus detection pixels 3, projected via the individual micro-lenses 3a, are superimposed, namely overlaid, in the right-side area EP1 at the exit pupil EP and the images of the "photoelectric conversion areas" corresponding to all the second focus detection pixels 4, projected via the individual micro-lenses 4a, are superimposed, namely overlaid, in the left-side area EP2 at the exit pupil EP.

As FIG. 7 clearly indicates, the right-side area EP1 and the left-side area EP2 at the exit pupil EP achieve right/left symmetry with respect to the intersecting point S at which the exit pupil EP and the central axis intersect and thus, even if vignetting attributable to the aperture of the photographic optical system or the like occurs at the right-side area EP1 and the left-side area EP2, such vignetting shall affect the right-side area EP1 and the left-side area EP2 in a uniform manner, which makes it possible to minimize the decrease in focus detection accuracy.

Figure 8A:
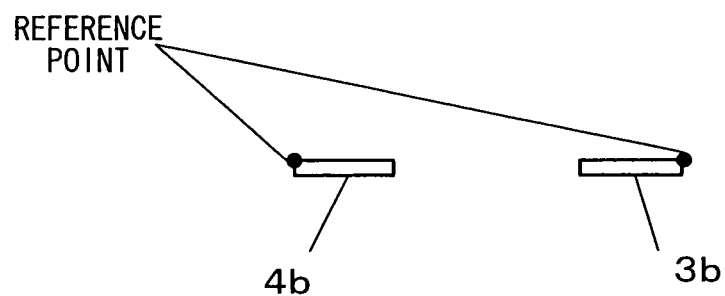
FIGS. 8A–8C each show the positional relationship between the reference point and the photoelectric conversion elements.

While an explanation is given above in reference to the embodiment on an example in which the right end of each photoelectric conversion element 3b is aligned with the corresponding reference point and the left end of each photoelectric conversion element 4b is aligned with the corresponding reference point, as shown in FIG. 8A, the photoelectric conversion elements 3b and 4b may be set so as to achieve positional relationships with the reference points other than those described above.

Figure 8B:
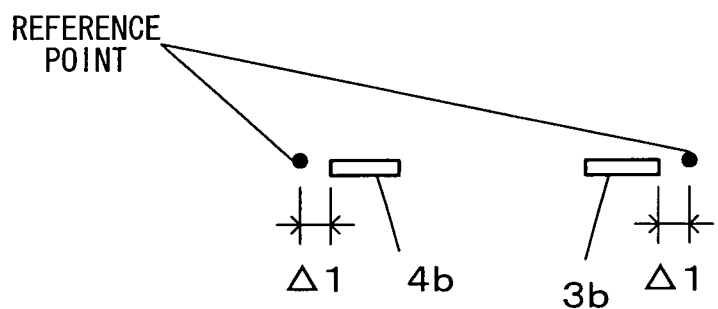

For instance, the photoelectric conversion element 3b at the first focus detection pixel 3 may be set further toward the central axis by positioning the right end of the photoelectric conversion element 3b over a distance Δ1 from the corresponding reference point and the photoelectric conversion element 4b at the second focus detection pixel 4 may be set further away from the central axis by positioning the left end of the photoelectric conversion element 4b over the distance Δ1 from the corresponding reference point, as shown in FIG. 8B. In this case, focus detection may be executed with a greater opening angle, making it possible to improve the focus detection accuracy.

Figure 8C:
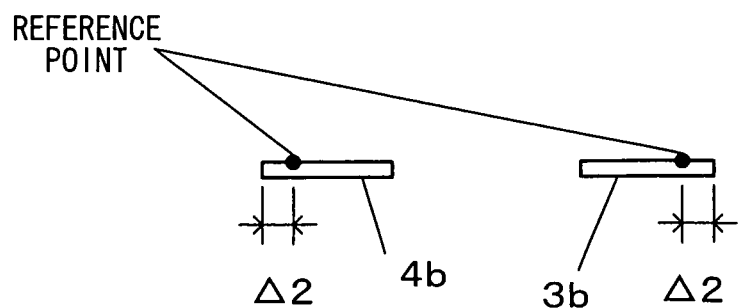

As an alternative, the reference point corresponding to the photoelectric conversion element 3b of the first focus detection pixel 3 may be positioned over a distance Δ2 from the right end of the photoelectric conversion element 3b and the reference point corresponding to the photoelectric conversion element 4b of the second focus detection pixel 4 may be positioned over a distance Δ2 from the left end of the photoelectric conversion element 4b, as shown in FIG. 8C. In this case, the right-side area EP1 and the left-side area EP2 are allowed to partially overlap each other at the exit pupil EP.

Figure 6:
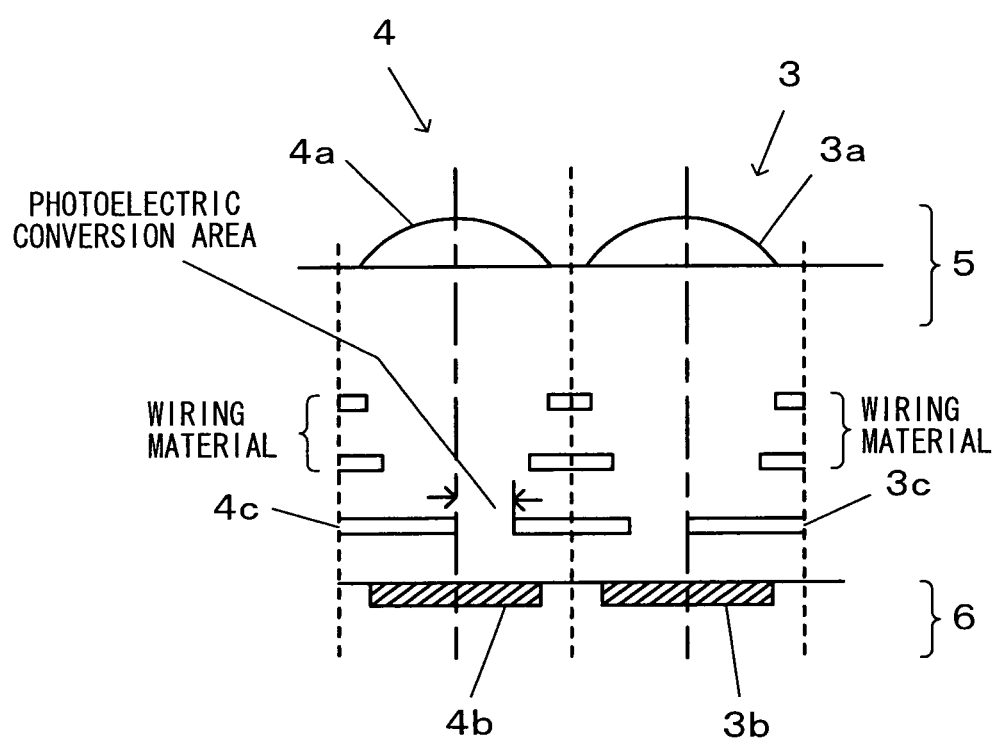
FIG. 6 shows photoelectric conversion areas defined by the mask openings.

While an explanation is given above on an example in which the photoelectric conversion elements 3b and 4b of the focus detection pixels 3 and 4 assuming the position with the image height h measured from the central axis of the image sensor 1 are offset to the reference points from the optical axes of the micro-lenses 3a and 4a in order to define the "photoelectric conversion areas" in correspondence to the ranges over which the light actually received at the photoelectric conversion elements 3b and 4b on the semiconductor substrate upon which the photoelectric conversion element array 6 is formed undergoes photoelectric conversion, as shown in FIG. 5, the "photoelectric conversion areas" may be defined in correspondence to the openings of the masks 3c and 4c disposed between the micro-lens array 5 and the photoelectric conversion element array 6, as shown in FIG. 6, by determining the positional relationships of the photoelectric conversion elements 3b and 4b to the micro-lenses 3a and 4a, as described below.

Figure 9:
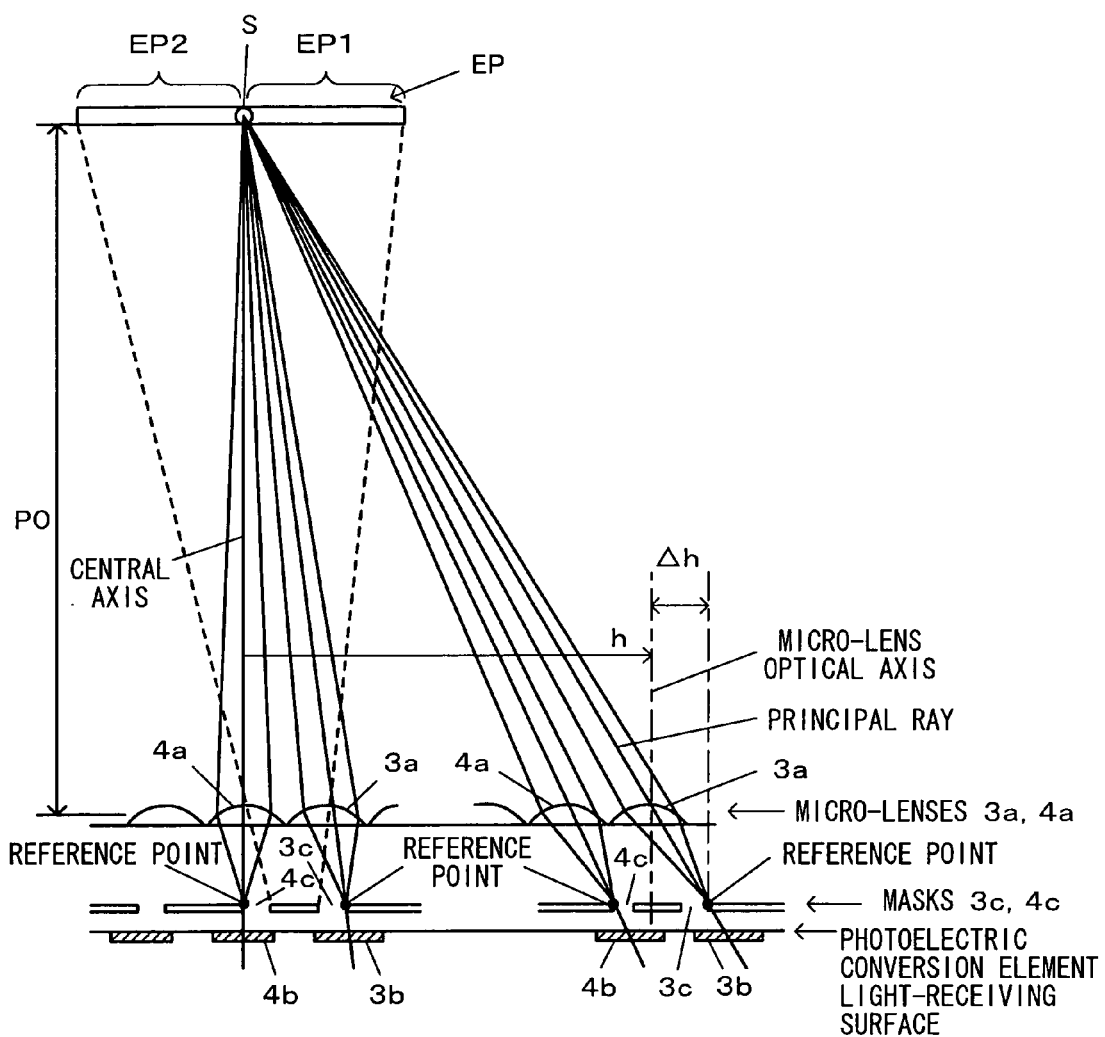
FIG. 9 is an optical path diagram showing a pair of light fluxes having passed through a pair of areas, i.e., a left area and a right area, in the exit pupil entering a pair of focus detection pixels disposed near the central axis (the vertical line passing through the point at which the optical axis of the photographic optical system intersects the image sensor) and focus detection pixels disposed near the point assuming an image height h measured from the central axis at an image sensor with photoelectric conversion areas defined by openings in the mask.

FIG. 9 is an optical path diagram showing a pair of light fluxes having passed through a pair of areas EP1 and EP2, i.e., a right-side area and a left-side area, in the exit pupil EP, entering a pair of focus detection pixels 3 and 4 disposed near the central axis (the vertical line passing through the point at which the optical axis of the photographic optical system intersects the image sensor) and focus detection pixels 3 and 4 disposed near the point assuming an image height h measured from the central axis at the image sensor with photoelectric conversion areas defined by the openings in the masks 3c and 4c. It is to be noted that in FIG. 9, corresponding to FIG. 7, the same reference numerals and the like are assigned to elements equivalent to those shown in FIG. 7.

First, in reference to FIG. 9, the optimization method adopted to achieve (1) above is described. At the first focus detection pixel 3 assuming the position with the image height h measured from the point at which the central axis of the image sensor 1 (the optical axis of the photographic optical system) intersects the imaging plane, the position of the opening of the mask 3c corresponding to the micro-lens 3a at the first focus detection pixel 3 is offset to the "reference point" from the optical axis of the micro-lens 3a. It is to be noted that the offset quantity Δh by which the opening is offset is univocally determined optically in correspondence to the image height h, the exit pupil distance PO and the like. The first focus detection pixel 3 is disposed so as to allow the opening in the mask 3c to range toward the central axis by aligning the right end of the opening in the mask 3c with the reference point, in order to allow the right light flux having passed through the right-side area EP1 of the exit pupil EP to be received at the photoelectric conversion element 3b via the micro-lens 3a and the opening in the mask 3c. It is to be noted that the photoelectric conversion element 3b at this first focus detection pixel 3 assumes a sufficient width as does the photoelectric conversion element 3b disposed near the central axis.

Likewise, the position of the opening in the mask 4c corresponding to the micro-lens 4a of the second focus detection pixel 4 is offset to the reference point from the optical axis of the micro-lens 4a. The second focus detection pixel 4 is disposed so that the opening in the mask 4c ranges further away from the central axis by aligning the left end of the opening in the mask 4c with the reference point in order to allow the left light flux having passed through the left-side area EP2 of the exit pupil EP to be received at the photoelectric conversion element 4b via the micro-lens 4a and the opening in the mask 4c. It is to be noted that the photoelectric conversion element 4b at the focus detection pixel 4 assumes a sufficient width as does the photoelectric conversion element 4b disposed near the central axis. The focus detection pixel 4 disposed on the central axis of the image sensor 1 assumes an image height h of 0 with the reference point thereof set on the central axis, and thus, the offset quantity by which the opening in the mask 4c must be offset is 0.

As described above, at the focus detection pixels 3 and 4 assuming the position with the image height h measured from the central axis of the image sensor 1, the openings in the masks 3c and 4c are offset to the respective "reference points" from the optical axes of the micro-lenses 3a and 4a. As a result, the images of the "photoelectric conversion areas" (openings in the masks 3c) corresponding to all the first focus detection pixels 3, projected via the individual micro-lenses 3a, are superimposed, namely overlaid, in the right-side area EP1 at the exit pupil EP and the images of the "photoelectric conversion areas" (openings in the masks 4c) corresponding to all the second focus detection pixels 4, projected via the individual micro-lenses 4a, are aligned in the left-side area EP2 at the exit pupil EP.

As FIG. 9 clearly indicates, the right-side area EP1 and the left-side area EP2 at the exit pupil EP achieve right/left symmetry with respect to the intersecting point S at which the exit pupil EP and the central axis intersect and thus, even if vignetting attributable to the aperture of the photographic optical system or the like occurs at the right-side area EP1 and the left-side area EP2, such vignetting shall affect the right-side area EP1 and the left-side area EP2 in a uniform manner, which makes it possible to minimize the decrease in focus detection accuracy.

It is to be noted that while an explanation is given above in reference to the embodiment on an example in which the right end of the opening in the mask 3c is aligned with the corresponding reference point and the left end of the opening in the mask 4c is aligned with the corresponding reference point, the openings in the masks 3c and 4c may be set so as to achieve positional relationships with the reference points other than those described above.

For instance, the opening of the mask 3c for the first focus detection pixel 3 may be set further toward the central axis by positioning the right end of the opening in the mask 3c over a distance Δ1 from the corresponding reference point and the opening of the mask 4c for the second focus detection pixel 4 may be set further away from the central axis by positioning the left end of the opening in the mask 4c over the distance Δ1 from the corresponding reference point, as shown in FIG. 8B. In this case, focus detection may be executed with a greater opening angle, making it possible to improve the focus detection accuracy.

As an alternative, the reference point corresponding to the first focus detection pixel 3 may be positioned over a distance Δ2 from the right end of the opening in the mask 3c and the reference point corresponding to the second focus detection pixel 4 may be positioned over the distance Δ2 from the left end of the opening in the mask 4c, as shown in FIG. 8C. In this case, the right-side area EP1 and the left-side area EP2 are allowed to partially overlap each other at the exit pupil EP.

Figure 10A:
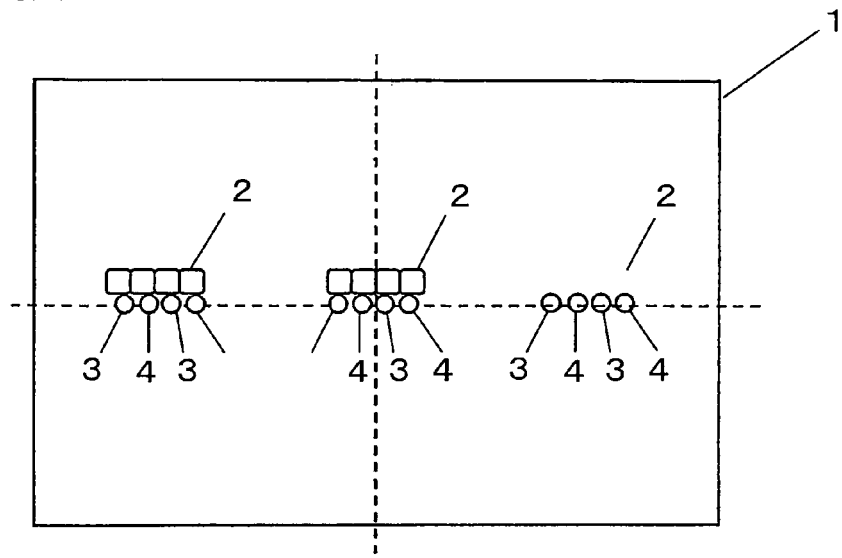
FIGS. 10A, 10B and 10C show the positional relationship between the micro-lenses and the photoelectric conversion elements at focus detection pixels and the positional relationship between the micro-lenses and the photoelectric conversion elements at image-capturing, in illustrations facilitating comparison of the positional relationships.
Figures 10B, 10C:
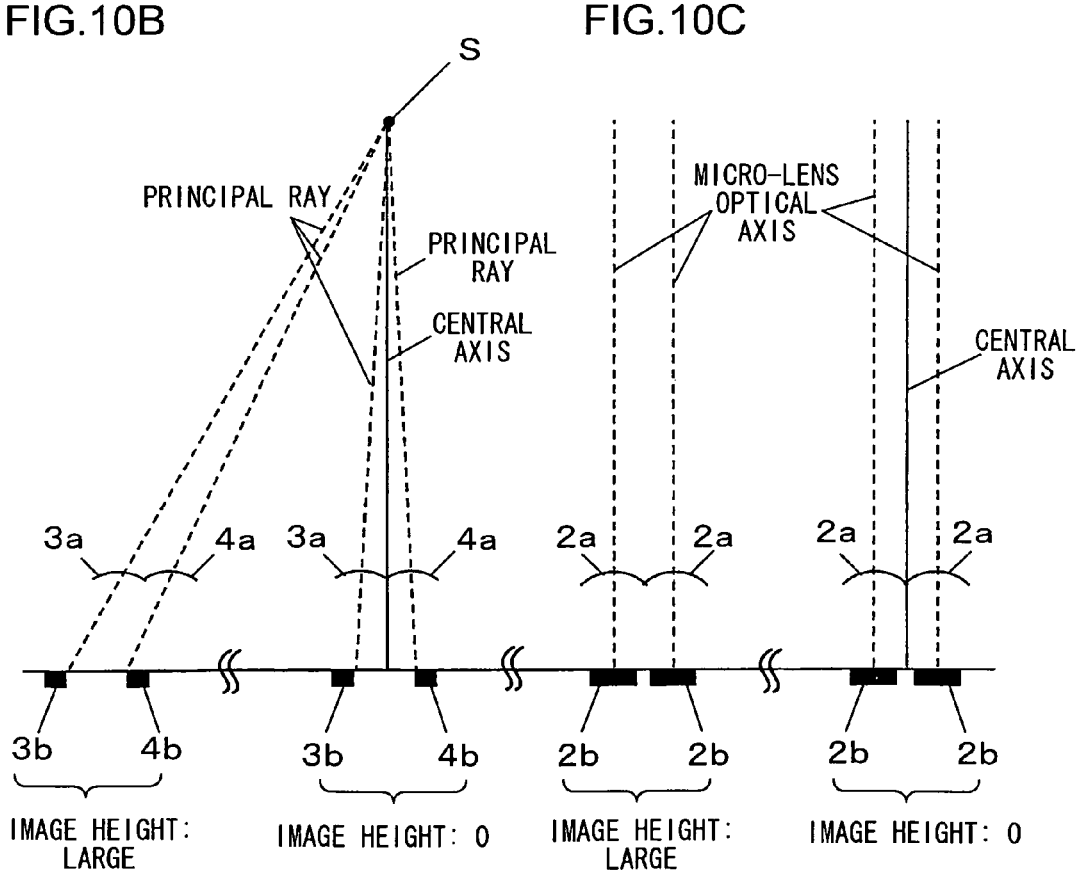

The positional relationship between the micro-lens 2a of an imaging pixel 2 and the "photoelectric conversion area" is now described. FIGS. 10A and 10B show the positional relationship of the photoelectric conversion elements 3b and 4b to the respective micro-lenses 3a and 4a at the focus detection pixels 3 and 4 and the positional relationship of the photoelectric conversion elements 2b to the corresponding micro-lenses 2a at the imaging pixels 2 as observed in the embodiment, in illustrations facilitating comparison thereof. FIG. 10A shows the image sensor 1 in a front view. The image sensor 1 includes rows of focus detection pixels 3 and 4 set at the center, a left-side position and a right-side position, as has been explained in reference to FIG. 1. It is to be noted that while FIG. 10A shows three rows of imaging pixels 2, each made up with four imaging pixels 2 and three rows of focus detection pixels 3 and 4, each made up with four focus detection pixels, to facilitate the explanation, focus detection pixels 3 and 4 may be disposed at positions and in quantities other than those shown in the figure.

As illustrated in FIG. 10B, the centers of the "photoelectric conversion areas", i.e., the centers of the photoelectric conversion elements 3b and 4b, are decentered further away from the optical axes of the micro-lenses 3a and 4a for focus detection pixels disposed further away from the center (the point at which the image sensor intersects the central axis of the photographic optical system in the embodiment), i.e., for focus detection pixels with a greater image height. In contrast, the photoelectric conversion elements 2b of the imaging pixels 2 are always aligned with the optical axes of the corresponding micro-lenses 2a, regardless of the image height measured from the center of the image sensor 1, as shown in FIG. 10C.

It is more crucial for the focus detection pixels 3 and 4 to assure good imaging performance whereby the light fluxes arriving thereat from specific areas further frontward relative to the focus detection pixels 3 and 4 are allowed to enter the photoelectric conversion elements 3b and 4b with a high level of reliability, instead of giving priority to achieving superior condensing performance via the micro-lenses 3a and 4a to maximize the amounts of light arriving at the image-capturing surface from multiple directions and entering the photoelectric conversion elements 3b and 4b. For this reason, the micro-lenses 3a and 4a are formed in a circular shape viewed from the front, the adjacent micro-lenses 3a and 4a are set so that they do not range continuously over their peripheries (in order to allow the micro-lenses to sustain the intended shape) and the centers of the photoelectric conversion elements 3b and 4b are decentered relative to the optical axes of the micro-lenses 3a and 4a in correspondence to the image height, so as to ensure that the light fluxes arriving at the focus detection pixels 3 and 4 corresponding to varying image heights from the same areas further frontward relative to the pixels are allowed to enter the photoelectric conversion elements 3b and 4b with a high level of reliability.

In contrast, it is more crucial for the imaging pixels 2 to assure good condensing performance whereby the amount of light arriving at the image-capturing surface from multiple directions and entering the photoelectric conversion elements 2b is maximized, instead of giving priority to providing superior imaging performance via the micro-lenses 2*a* to allow the light fluxes arriving from the same areas further frontward relative to the pixels to enter the photoelectric conversion elements 2*b* with a high level of reliability. For this reason, the micro-lenses 2*a* are formed in a rectangular shape with a significant width viewed from the front, adjacent micro-lenses 2*a* are set densely in close proximity to each other so that they range continuously over their peripheries and the centers of the photoelectric conversion elements 2*b* are always aligned with the optical axes of the corresponding micro-lenses 2*a* regardless of the image height so as to assure the desired performance and facilitate the manufacturing process.

It is to be noted that while the "photoelectric conversion areas" are defined in relation to the photoelectric conversion elements 2*b*, 3*b* and 4*b* in the example presented in FIG. 10, similar positional relationships may be assumed when the "photoelectric conversion areas" are defined in relation to the masks (the masks 3*c* and 4*c* for the focus detection pixels 3 and 4 and the masks used to regulate the areas where light actually received at the imaging pixels 2 undergoes photoelectric conversion (not shown)).

Next, a method that may be adopted to optimize the image-forming performance of the micro-lenses 3*a* and 4*a* at the focus detection pixels 3 and 4 in reference to the exit pupil distance PO as described in (2) earlier is explained. The "photoelectric conversion areas" are defined either by the ranges where the light actually received at the photoelectric conversion elements 3*b* and 4*b* on the semiconductor substrate upon which the photoelectric conversion element array 6 is formed undergoes photoelectric conversion or by the openings in the masks 3*c* and 4*c*. It is desirable to minimize the extent of blurring of the images projected onto the exit pupil EP via the micro-lenses 3*a* and 4*a* over these photoelectric conversion areas. The less the extent of blurring, the less the extent of vignetting occurring for the pair of focus detection light fluxes at the exit pupil EP, i.e., the right light flux passing through the right-side area EP1 and the left light flux passing through the left-side area EP2 and thus, better focus detection accuracy is assured. If a significant extent of blurring occurs, the signal intensity in the images of the photoelectric conversion areas having been projected is bound to decrease significantly over a greater range at the outer edges and vignetting occurs readily at the exit pupil EP, which shall result in degraded focus detection accuracy.

Accordingly, the highest level of definition is achieved over the areas separating the images of the "photoelectric conversion areas" projected at the exit pupil EP set over the exit pupil distance PO from the micro-lenses 3*a* and 4*a*, by (2-1) setting a specific curvature for the micro-lenses 3*a* and 4*a* at the focus detection pixels 3 and 4, by (2-2) setting a specific distance between the micro-lenses 3*a* and 4*a* and the positions of the "photoelectric conversion areas" measured along the central axis (along the optical axis of the photographic optical system in the embodiment) or by implementing both (2-1) and (2-2) above.

It is to be noted that the distance between the micro-lenses 3*a* and 4*a* and the positions of the "photoelectric conversion areas" measured along the central axis is equivalent to the distance between the micro-lenses 3*a* and 4*a* and the light-receiving surfaces of the photoelectric conversion elements 3*b* and 4*b* measured along the central axis when the "photoelectric conversion areas" are defined in relation to the ranges over which the light actually received at the photoelectric conversion elements 3*b* and 4*b* on the semiconductor substrate undergoes the photoelectric conversion as has been described in reference to FIG. 7, whereas it is equivalent to the distance between the micro-lenses 3*a* and 4*a* and the surface upon which the masks 3*c* and 4*c* are disposed measured along the central axis when the "photoelectric conversion areas" are defined by the openings in the masks 3*c* and 4*c*, as has been described in reference to FIG. 9.

It is also to be noted that through either of the measures described in (2-1) and (2-2) above, it is ensured that the surface upon which the "photoelectric conversion areas" are set and the plane of the exit pupil EP assume a conjugate relationship relative to the micro-lenses 3*a* and 4*a*.

At the image sensor 1 in the embodiment described above, (1) the positions of the "photoelectric conversion areas" are optimized relative to the exit pupil distance PO and (2) the imaging performance of the micro-lenses 3*a* and 4*a* of the focus detection pixels 3 and 4 is optimized relative to the exit pupil distance PO. As a result, the pair of focus detection light fluxes (the right light flux and the left light flux) having passed through the different areas EP1 and EP2 at the exit pupil EP of the photographic optical system are allowed to enter the photoelectric conversion elements 3*b* and 4*b* with precision even at focus detection pixels 3 and 4 disposed at positions further away from the point at which the light-receiving surface of the image sensor 1 intersects the optical axis of the photographic optical system, making it possible to assure the desired level of focus detection accuracy in conjunction with the split-pupil phase difference detection method.

It is to be noted that the desired level of focus detection accuracy may be sustained at the image sensor 1 in the embodiment simply by (1) optimizing the positions of the "photoelectric conversion areas" relative to the exit pupil distance PO.

Figure 11:
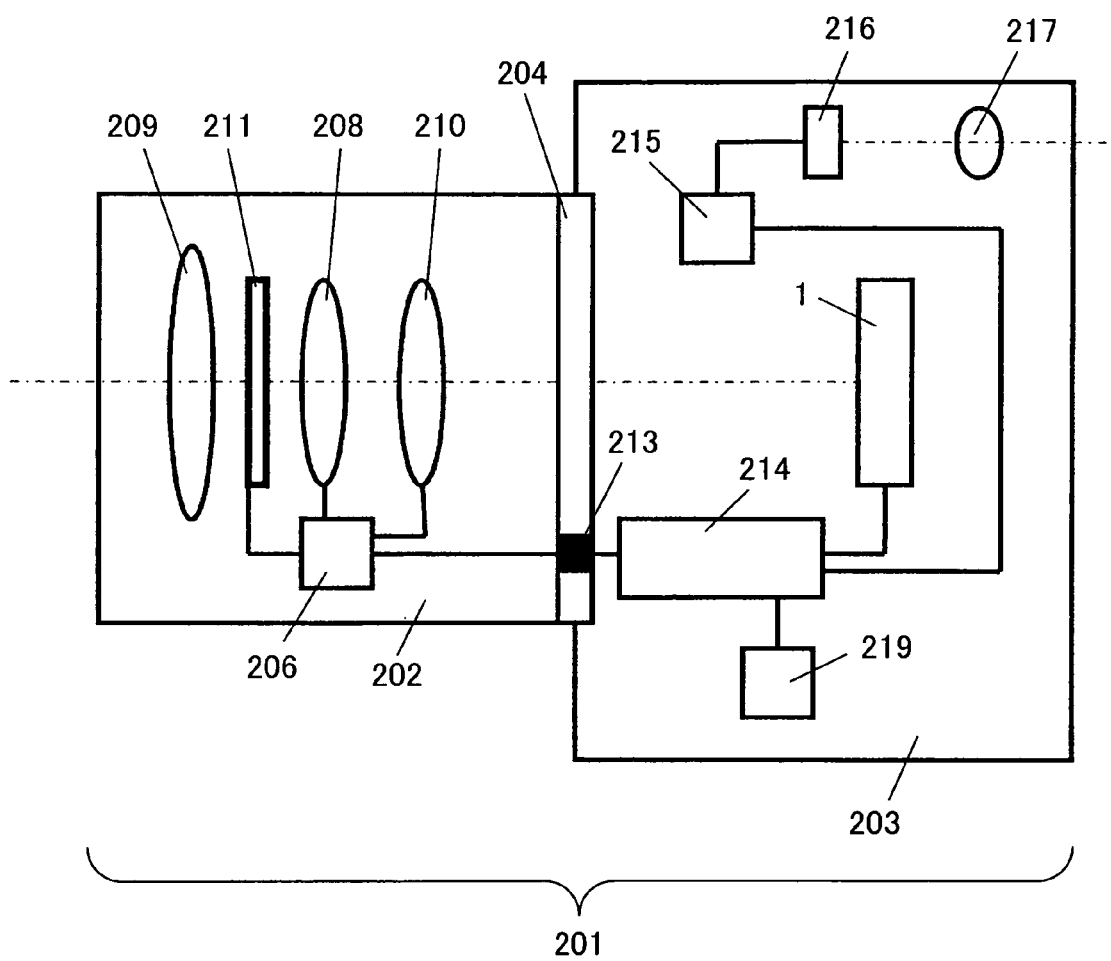
FIG. 11 shows the structure adopted in the image-capturing device achieved in an embodiment.

Next, an embodiment in which the image sensor 1 described above is adopted in a single lens reflex digital camera (image-capturing device) equipped with an autofocus function is described. As shown in FIG. 11, A digital still camera 201 achieved in the embodiment includes an exchangeable lens 202 and a camera body 203. The exchangeable lens 202 is mounted at the camera body 203 via a mount unit 204. Any one of exchangeable lenses 202 equipped with various image-forming optical systems may be mounted at the camera body 203 via the mount unit 204.

The exchangeable lens 202 includes a zooming lens 208, a focusing lens 210, an aperture 211, a lens drive control device 206 and the like. The lens drive control device 206, constituted with a microcomputer, a memory, a drive control circuit and the like (none shown), engages in communication with a body drive control device 214 to be detailed later to transmit lens information to the body drive control device 214 and receive camera information from the body drive control device 214, as well as executing drive control to adjust the focusing condition at the focusing lens 210 and adjust the opening diameter at the aperture 211 and detecting the states of the zooming lens 208, the focusing lens 210 and the aperture 211. The aperture 211 forms an opening with an adjustable opening diameter, centered on the optical axis, so as to adjust the amount of light and adjust the extent of blurring.

The image sensor 1, having been described above, the body drive control device 214, a liquid crystal display element drive circuit 215, a liquid crystal display element 216, an eyepiece lens 217, a memory card 219 and the like are disposed at the camera body 203. Imaging pixels are two-dimensionally arrayed at the image sensor 1 and focus detection pixels are also built into the image sensor over areas corresponding to focus detection positions.

The body drive control device 214 includes a microcomputer, a memory, a drive control circuit and the like. It executes drive control of the image sensor 1, reads out image signals and focus detection signals, repeatedly executes focus detection calculation based upon focus detection signals and adjusts focus in the exchangeable lens 202, processes and records the image signals and controls camera operations. In addition, the body drive control device 214 engages in communication with the lens drive control device 206 via an electrical contact point 213 to receive the lens information and transmit the camera information (indicating the defocus amount, the aperture value and the like).

The liquid crystal display element 216 functions as an electronic viewfinder (EVF). A live image provided by the image sensor 1, brought up on display at the liquid crystal display element 216 by the liquid crystal display element drive circuit 215, may be observed by the photographer via the eyepiece lens 217. The memory card 219 is an image storage medium in which an image captured by the image sensor 1 is stored.

A subject image is formed on the light-receiving surface of the image sensor 1 with a light flux having passed through the exchangeable lens 202. The subject image undergoes photoelectric conversion at the image sensor 1 and subsequently, image signals and focus detection signals are transmitted to the body drive control device 214.

The body drive control device 214 calculates the defocus amount indicating the extent of defocus based upon the focus detection signals output from the focus detection pixels at the image sensor 1 and transmits this defocus amount to the lens drive control device 206. In addition, the body drive control device 214 generates an image by processing the image signals provided from the image sensor 1 and stores the image into the memory card 219. It also provides live image signals from the image sensor 1 to the liquid crystal display element drive circuit 215 so as to bring up a live image on display at the liquid crystal display element 216. Moreover, the body drive control device 214 provides aperture control information to the lens drive control device 206 to enable control of the aperture 211.

The lens drive control device 206 updates the lens information in correspondence to the current focusing state, zooming state and aperture setting state, the maximum aperture number and the like. More specifically, the lens drive control device 206 detects the positions of the zooming lens 208 and the focusing lens 210 and the aperture value set for the aperture 211, and calculates correct lens information based upon the lens positions and the aperture value. Alternatively, it may select the lens information corresponding to the lens positions and the aperture value from a lookup table prepared in advance.

The lens drive control device 206 calculates a lens drive quantity indicating the extent to which the lens is to be driven based upon the defocus amount having been received and drives the focusing lens 210 to a focusing position based upon the lens drive quantity. The lens drive control device 206 also drives the aperture 211 in correspondence to the aperture value it has received.

Figure 12:
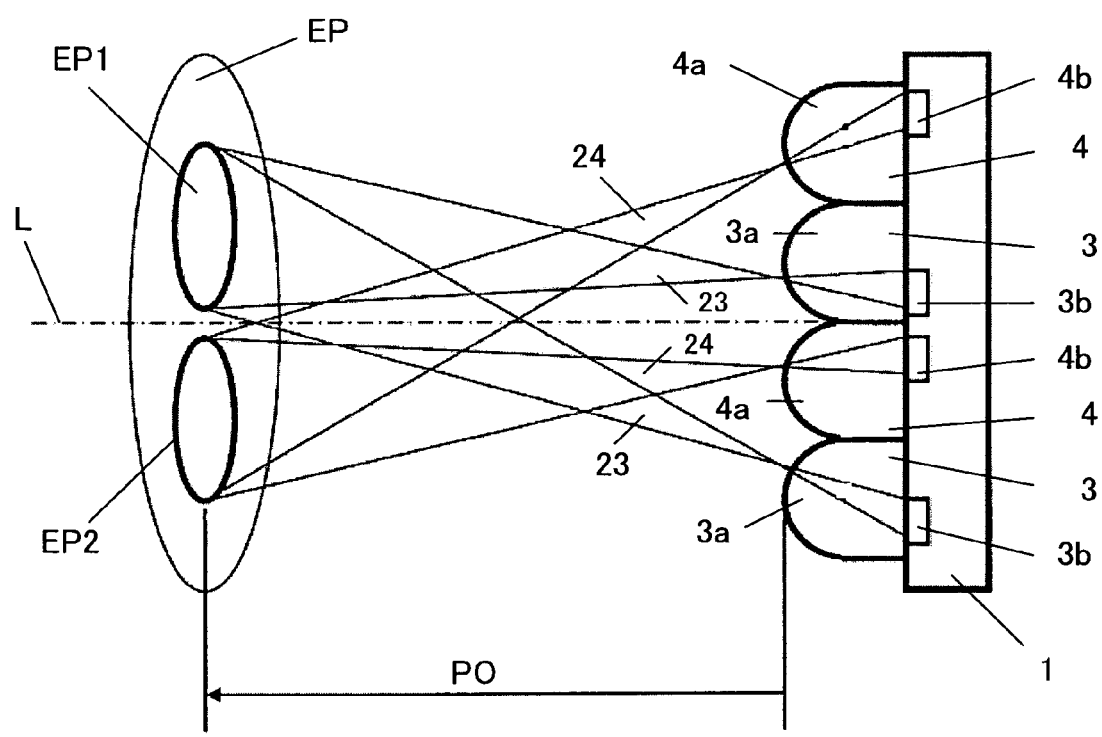
FIG. 12 illustrates the focus detection method adopted in the image-capturing device in the embodiment.

FIG. 12 shows the structure of a focus detection optical system used to detect the focusing condition through the split-pupil phase difference detection method by using micro-lenses. It is to be noted that the focus detection pixels are shown in an enlargement. EP in the figure indicates the exit pupil set over a distance PO along the frontward direction from the micro-lenses disposed at the predetermined imaging plane of the exchangeable lens 202 (see FIG. 11). The distance PO is determined in correspondence to the curvature of the micro-lenses, the refractive index of the micro-lenses, the distance between the micro-lenses and the surface where the "photoelectric conversion areas" are set and the like, and is referred to as a focus detection distance in this description.

EP1 indicates a range defined by the photoelectric conversion elements 3b projected via the micro-lenses 3a, and this range is referred to as a right-side area in the description. While EP1 is shown as an elliptical area in FIG. 12 so as to simplify the illustration, the area actually assumes the shape of the photoelectric conversion elements 36 projected in an enlarged state. Likewise, EP2 indicates a range defined by the photoelectric conversion elements 4b projected via the micro-lenses 4a, and this range is referred to as a left-side area in the description. While FIG. 12 shows EP2 as an elliptical area so as to simplify the illustration, the area actually assumes the shape of the photoelectric conversion elements 46 projected in an enlarged state.

While FIG. 12 schematically illustrates two first focus detection pixels 3 and two second focus detection pixels 4 disposed near the optical axis L of the photographic optical system, the photoelectric conversion elements of focus detection pixels distanced from the optical axis L also receive light fluxes arriving at their micro-lenses from the corresponding right-side area EP1 and left-side area EP2. The focus detection pixels are arrayed in a direction matching the direction in which the pair of areas, the right-side area EP1 and the left-side area EP2, are set side-by-side, i.e., the direction along which the photo electric conversion elements in each pair are set side-by-side.

The micro-lenses 3a and 4a are disposed near the predetermined imaging plane of the exchangeable lens 202 (see FIG. 11). Images of the photoelectric conversion elements 3b and 4b disposed behind the micro-lenses 3a and 4a are projected via the micro-lenses 3a and 4a onto the exit pupil EP set apart from the micro-lenses 3a and 4a by the exit pupil distance PO, and the projected shapes of the "photoelectric conversion areas" define the right-side area EP1 and the left-side area EP2. Namely, the positional relationship between the micro-lens and the surface at which the photoelectric conversion element is disposed at each focus detection pixel is determined so that the projected shapes of the photoelectric conversion areas at the individual focus detection pixels are aligned on the exit pupil EP located over the distance PO.

The photoelectric conversion elements 3b each output a signal corresponding to the intensity of an image formed on the micro-lens 3a with a light flux 23 having passed through the right-side area EP1 and having advanced toward the micro-lens 3a. Likewise, the photoelectric conversion elements 4b each output a signal corresponding to the intensity of an image formed on the micro-lens 4a with a light flux 24 having passed through the left-side area EP2 and having advanced toward the micro-lens 4a.

By linearly disposing the two types of focus detection pixels each structured as described above in large numbers and integrating the outputs from the photoelectric conversion elements at the individual focus detection pixels into output groups each corresponding to either the right-side area EP1 or the left-side area EP2, information related to the intensity distribution of the pair of images formed on the focus detection pixel row with the individual focus detection light fluxes passing through the right-side area EP1 and the left-side area EP2 is obtained. Image shift detection arithmetic processing (correlation arithmetic processing, phase difference detection processing) of the known art is subsequently executed by using the information thus obtained so as to detect the extent of image shift manifested by the pair of images through the split-pupil phase difference detection method. Then, by executing a conversion operation on the image shift amount in correspondence to the distance between the gravitational centers of the pair of areas EP1 and EP2, the defocus amount is calculated.

Figure 13:
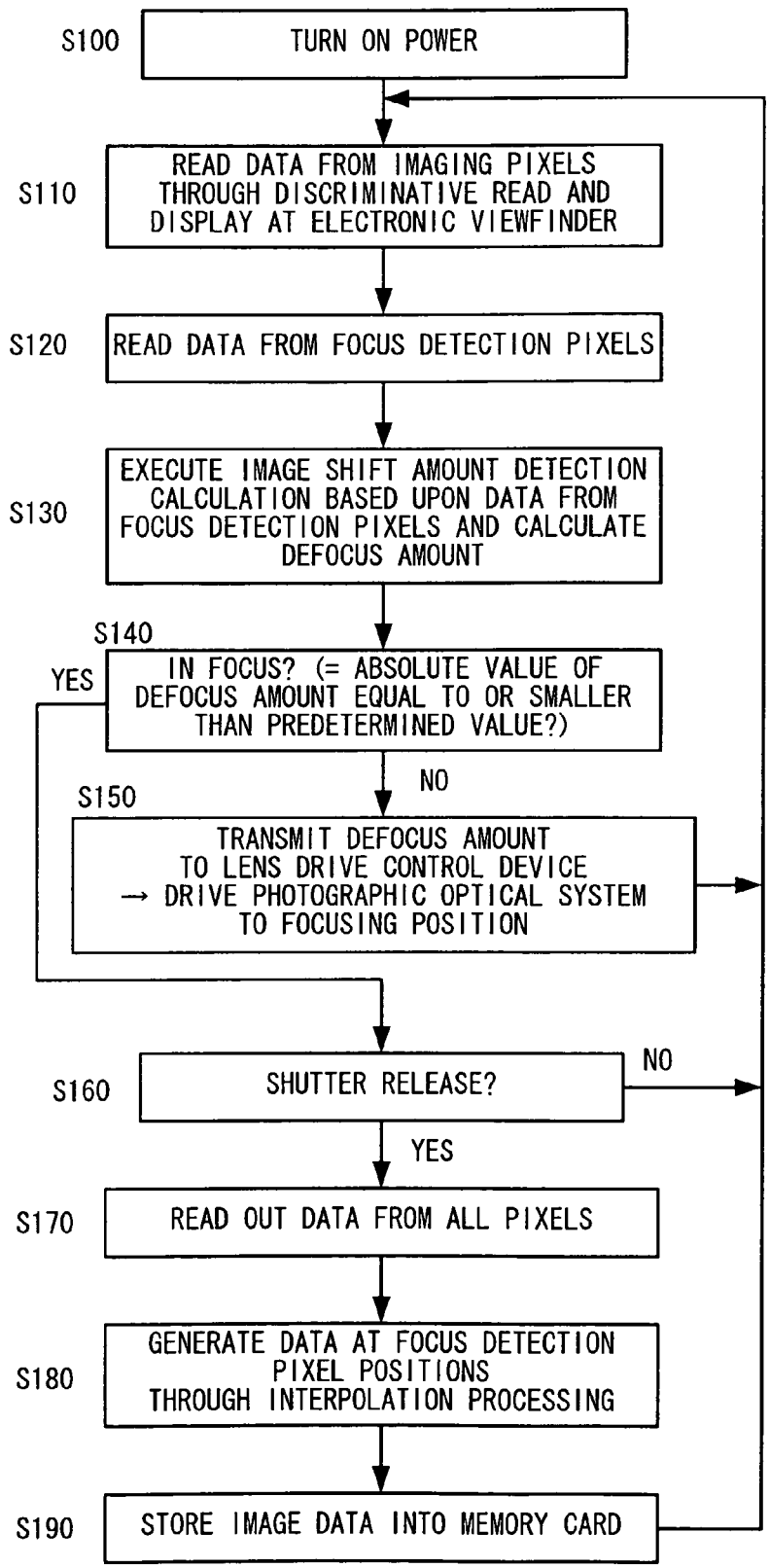
FIG. 13 presents a flowchart of the image-capturing operation executed in the embodiment.

FIG. 13 presents a flowchart of the image-capturing operation executed in the single lens reflex digital camera in the embodiment. The body drive control device 214 starts the image-capturing operation in step S110 and subsequent steps as the power to the camera is turned on in step S100. In step S110, the data from the imaging pixels are read out through a discriminative read and the data from the imaging pixels are displayed at the electronic viewfinder. In the following step S120, a pair of sets of image data corresponding to the pairs of images, are read out from the focus detection pixels 3 and 4.

In step S130, the image shift detection arithmetic processing in the known art is executed based upon the pair of sets of image data having been read, to calculate an image shift amount and ultimately calculate the defocus amount through conversion. In step S140, a decision is made as to whether or not the current condition is close to being in focus, i.e., whether or not the absolute value of the defocus amount having been calculated is equal to or less than a predetermined value. If it is decided that the current condition is not close to being in focus, the operation proceeds to step S150 to transmit the calculated defocus amount to the lens drive control device 206 which then drives the focusing lens 210 at the exchangeable lens 202 to the focusing position. Then, the operation returns to step S110 to repeatedly execute the operation described above.

It is to be noted that the operation also branches to this step if focus detection is not possible to transmit a scan drive instruction to the lens drive control device 206. In response, the lens drive control device drives the focusing lens 210 at the exchangeable lens 202 to scan between the infinity position and the close-up position. Subsequently, the operation returns to step S110 to repeatedly execute the operation described above.

If it is decided in step S140 that the current condition is close to being in focus, the operation proceeds to step S160 to make a decision as to whether or not a shutter release has occurred in response to an operation of the shutter release button (not shown). If it is decided that a shutter release has not yet occurred, the operation returns to step S110 to repeatedly execute the operation described above. If it is decided that a shutter release has occurred, the operation proceeds to step S170 to transmit an aperture adjust instruction to the lens drive control device 206 and thus set the aperture value at the exchangeable lens 202 to the control F number (an F number selected by the photographer or an automatically set F number). As the aperture control ends, the image sensor 1 is engaged in an image-capturing operation and image data originating from the imaging pixels 2 and all the focus detection pixels 3 and 4 at the image sensor 1 are read out.

In step S180, image data at positions assumed by the individual pixels in the focus detection pixel rows are generated through pixel interpolation based upon the data at imaging pixels 2 present around the focus detection pixels 3 and 4. In the following step S190, image data constituted with the data at the imaging pixels and the interpolated data are recorded into the memory card 219, and then the operation returns to step S110 to repeatedly execute the operation described above.

It is to be noted that while an explanation is given in reference to the embodiments on an example in which the two types of focus detection pixels are disposed alternately to each other over a central area, a left area and a right area at the image sensor 1, focus detection pixel rows may be set at positions, in quantities and along directions other than those described in reference to the embodiments. For instance, focus detection pixels may be disposed so that a vertical focus detection pixel row and a horizontal focus detection pixel row intersect each other in a cross shape.

In addition, while the two types of focus detection pixels are disposed alternately to each other in the description of the embodiment provided above, the two types of focus detection pixels may be disposed with a pattern other than that assumed in the embodiments. For instance, they may be disposed with the following pattern; first focus detection pixel-first focus detection pixel-second focus detection pixel-second focus detection pixel-first focus detection pixel-first focus detection pixel-second focus detection pixel-second focus detection pixel . . . . In addition, focus detection pixels may be disposed over two successive rows as well.

While the first focus detection pixels 3 each include a focus detection pixel element 3b assuming a rectangular shape corresponding to the left half of the focus detection pixel, viewed from the front, and the second focus detection pixels 4 each include a photoelectric conversion element 4b assuming a rectangular shape corresponding to the right half of the focus detection pixel, viewed from the front, in the description provided above, the shapes of the photoelectric conversion elements at the focus detection pixels viewed from the front are not limited to these examples and they may instead assume, for instance, semicircular shapes corresponding to the left half and the right half of the focus detection pixels, instead.

It is to be noted that while the embodiments and variations are described above in reference to a pair of focus detection light fluxes, the right light flux and the left light flux, having passed through two different areas, i.e., the right-side area and the left-side area, of the exit pupil of the photographic optical system, these light fluxes simply represent an example and it shall be obvious that the present invention may be adopted in conjunction with light fluxes passing through areas set at other positions on the exit pupil plane, e.g., top/bottom positions or diagonal positions, along any direction assumed around the optical axis of the photographic optical system. In addition, the pair of light fluxes passing through the exit pupil of the photographic optical system, i.e., the right light flux and the left light flux, as described in the embodiments and variations are equivalent to a pair of light fluxes, i.e., a right light flux and a left light flux, passing through the photographic optical system.

The following advantages are achieved through the embodiments and variations. At an image sensor that includes focus detection pixels each constituted with a micro-lens and a photoelectric conversion element, disposed so as to occupy part of the two-dimensional array of imaging pixels each constituted with a micro-lens and a photoelectric conversion element, a light flux having passed through a photographic optical system is received at each photoelectric conversion element via the corresponding micro-lens. The focus detection pixels include a plurality of first focus detection pixels each of which receives mainly one of light fluxes in a light flux pair transmitted through the photographic optical system and a plurality of second focus detection pixels, each of which receives mainly the other light flux in the light flux pair transmitted through the photographic optical system. The positional relationship between the micro-lens at each focus detection pixel and the corresponding photoelectric conversion area where the light flux transmitted through the micro-lens of the focus detection pixel undergoes photoelectric conversion at the corresponding photoelectric conversion element, is determined in correspondence to the image height at the image sensor light-receiving surface, so as to ensure that a plurality of images of the photoelectric conversion areas of all the first focus detection pixels, projected via the respective micro-lenses onto the exit pupil plane of the photoelectric optical system, set over a specific distance from the micro-lenses are aligned with one another and that a plurality of images of the photoelectric conversion areas of all the second focus detection pixels projected via the respective micro-lenses onto the pupil plane are aligned with one another. As a result, even at focus detection pixels disposed at a position further away from the point at which the image sensor light-receiving surface intersects the optical axis of the photographic optical system, the pair of focus detection light fluxes (the right light flux and the left light flux) having passed through the different areas of the exit pupil of the photographic optical system are allowed to enter the photoelectric conversion elements of the focus detection pixels accurately and, as a result, the focus detection accuracy achieved through the split-pupil phase difference detection method is sustained at a high level.

In addition, a substantially conjugate relationship is achieved for the photoelectric conversion areas and the exit pupil plane by setting a specific curvature for the individual micro-lenses, by setting a specific distance between the micro-lenses and the photoelectric conversion area setting plane, measured along the optical axis of the photoelectric optical system, or by implementing both measures. Consequently, an image of the photoelectric conversion area projected onto the exit pupil plane via the micro-lens at a given first focus detection pixel and an image of the photoelectric conversion area projected via the micro-lens at the adjacent second focus detection pixel achieve a high level of definition and since vignetting does not, therefore, occur readily, the focus detection accuracy achieved through the split-pupil phase difference method sustains a high level.

The above described embodiments are examples and various modifications can be made without departing from the scope of the invention.

What is claimed is:

1. An image sensor, comprising:
    a plurality of imaging pixels, each constituted with a first micro-lens and a first photoelectric conversion element that receives, via the first micro-lens, an image-capturing light flux transmitted through a photographic optical system and executes photoelectric conversion on the received image-capturing light flux at a photoelectric conversion area in the first photoelectric conversion element; and
    a plurality of focus detection pixels disposed within a two-dimensional array of the plurality of imaging pixels, and made up with a plurality of first focus detection pixels each of which receives one light flux in a pair of focus detection light fluxes transmitted through the photographic optical system and a plurality of second focus detection pixels each of which receives the other light flux in the pair of focus detection light fluxes, the plurality of focus detection pixels each being constituted with a second micro-lens and a second photoelectric conversion element, wherein:
        the second photoelectric conversion element in each of the plurality of first focus detection pixels includes a first light-receiving area where the one light flux is received;
        the second photoelectric conversion element in each of the plurality of second focus detection pixels includes a second light-receiving area where the other light flux is received;
        light-receiving area images corresponding to each of the plurality of focus detection pixels are each formed as the first and second light-receiving areas are projected via the second micro-lens onto a pupil plane of the photographic optical system;
        a positional relationship of the second micro-lens and the first and second light-receiving areas is determined in correspondence to an image height so that the light-receiving area images corresponding to all the first focus detection pixels are superimposed on one another and that the light-receiving area images corresponding to all the second focus detection pixels are superimposed on one another on the pupil plane; and
        the second micro-lens assumes a circular shape viewed from the front and the first micro-lens assumes a substantially rectangular shape viewed from the front.

2. An image sensor according to claim 1, wherein:
the first light-receiving area receives the one light flux and part of the other light flux and the second light-receiving area receives the other light flux and part of the one light flux.

3. An image sensor according to claim 1, wherein:
the first and second light-receiving areas and the pupil plane achieve a substantially conjugate relationship in relation to the second micro-lens.

4. An image sensor according to claim 1, wherein:
the second photoelectric conversion element includes a photoelectric conversion area; and
the first and second light-receiving areas are defined by the photoelectric conversion area.

5. An image sensor according to claim 1, wherein:
the second photoelectric conversion element includes a photoelectric conversion area;
the plurality of focus detection pixels each include a shielding mask covering part of the photoelectric conversion area; and
the first and second light-receiving areas are defined by the shielding mask.

6. An image sensor according to claim 1, wherein:
the second micro-lens assumes either a circular shape or a substantially circular shape in a sectional view.

7. An image sensor according to claim 1, wherein:
the positional relationship between the first micro-lens and the photoelectric conversion area in the first photoelectric conversion element is uniform regardless of the image height; and
the centers of the first and second light-receiving areas are decentered further away from optical axes of the second micro-lens for focus detection pixels disposed further away from a point at which the image sensor intersects a central axis of the photographic optical system.

8. An image-capturing device, comprising:
an image sensor according to claim 1;
an image generation unit that generates a subject image based upon outputs from the plurality of imaging pixels;
a focus detection unit that detects a focusing condition for the photographic optical system based upon outputs from the plurality of focus detection pixels; and
a focus adjustment unit that executes focus adjustment for the photographic optical system based upon detection results provided by the focus detection unit.

9. An image sensor according to claim 1, wherein:
the first micro-lens and an adjacent first micro-lens range continuously over peripheries of the first micro-lens and the adjacent first micro-lens; and the second micro-lens and an adjacent second micro-lens do not range continuously over peripheries of the second micro-lens and the adjacent second micro-lens.

10. An image sensor according to claim 1, wherein:
the first and second light-receiving areas are positioned over a distance relative to a reference point, wherein
the reference point corresponds to a point at which a principal ray of the focus detection light flux departing a point at an exit pupil of the photographic optical system and entering the second micro-lens assuming a position with the image height intersects a plane including the first and second light-receiving areas.

11. An image sensor according to claim 1, wherein:
the positional relationship of the second micro-lens and the first and second light-receiving areas is different from a positional relationship between the first micro-lens and the photoelectric conversion area.

* * * * *